United States Patent
Lee et al.

(10) Patent No.: US 7,943,858 B2
(45) Date of Patent: May 17, 2011

(54) THIN FILM CAPACITOR, THIN FILM CAPACITOR-EMBEDDED PRINTED CIRCUIT BOARD AND MANUFACTURING METHOD OF THIN FILM CAPACITOR

(75) Inventors: Seung Eun Lee, Gyunggi-do (KR); Yul Kyo Chung, Gyunggi-do (KR); Jung Won Lee, Seoul (KR); In Hyung Lee, Seoul (KR); Byung Ik Song, Gyunggi-do (KR)

(73) Assignee: Samsung Electro-Mechanics Co. Ltd., Gyunggi-do (KR)

( * ) Notice: Subject to any disclaimer, the term of this patent is extended or adjusted under 35 U.S.C. 154(b) by 279 days.

(21) Appl. No.: 12/076,989

(22) Filed: Mar. 26, 2008

(65) Prior Publication Data

US 2008/0236878 A1  Oct. 2, 2008

(30) Foreign Application Priority Data

Mar. 29, 2007 (KR) ............... 10-2007-0030876

(51) Int. Cl.
  *H05K 1/16* (2006.01)
(52) U.S. Cl. .............................. 174/260; 174/256
(58) Field of Classification Search .......... 174/265–262; 361/306.1, 321.5, 305; 257/532, 310, 295; 427/98.4, 58, 123; 29/25.42, 25.41
  See application file for complete search history.

(56) References Cited

U.S. PATENT DOCUMENTS

| | | | |
|---|---|---|---|
| 5,439,845 A * | 8/1995 | Watanabe et al. | 438/396 |
| 5,888,296 A * | 3/1999 | Ooms et al. | 117/92 |
| 6,452,780 B2 | 9/2002 | Kobayashi et al. | |
| 2002/0098330 A1 * | 7/2002 | Masuko | 428/209 |
| 2004/0220044 A1 * | 11/2004 | Jacquin et al. | 501/139 |
| 2006/0044734 A1 * | 3/2006 | Ahn et al. | 361/313 |
| 2007/0004165 A1 * | 1/2007 | Shin et al. | 438/393 |
| 2010/0112195 A1 * | 5/2010 | Kodas et al. | 427/98.4 |

FOREIGN PATENT DOCUMENTS

| | | |
|---|---|---|
| JP | 2001-189229 | 7/2001 |
| KR | 10-2007-0002393 A | 1/2007 |

OTHER PUBLICATIONS

Chinese Office Action, with English translation, issued in Chinese Patent Application No. 200810088819.2, mailed Jul. 27, 2010.
Park, J.H., et al., "Bismuth-zinc-niobate embedded capacitors grown at room temperature for printed circuit board applications", Applied Physics Letters, 2006, vol. 88 192902, American Institute of Physics.

* cited by examiner

*Primary Examiner* — Yuriy Semenenko
(74) *Attorney, Agent, or Firm* — McDermott Will & Emery LLP

(57) ABSTRACT

There is provided a thin film capacitor and a capacitor-embedded printed board improved in leakage current characteristics. A dielectric layer is formed of a BiZnNb-based amorphous metal oxide with a predetermined dielectric constant without being heat treated at a high temperature, and metallic phase bismuth of the BiZnNb-based amorphous metal oxide is adjusted in content to attain a desired dielectric constant. Also, another dielectric layer having a different content of metallic phase bismuth may be formed. The thin film capacitor including: a first electrode; a dielectric layer including a first dielectric film formed on the first electrode, the dielectric layer comprising a BiZnNb-based amorphous metal oxide; and a second electrode formed on the dielectric layer, wherein the BiZnNb-based amorphous metal oxide contains metallic phase bismuth.

18 Claims, 8 Drawing Sheets

US 7,943,858 B2

THIN FILM CAPACITOR, THIN FILM CAPACITOR-EMBEDDED PRINTED CIRCUIT BOARD AND MANUFACTURING METHOD OF THIN FILM CAPACITOR

CROSS-REFERENCE TO RELATED APPLICATIONS

This application claims the priority of Korean Patent Application No. 2007-30876 filed on Mar. 29, 2007, in the Korean Intellectual Property Office, the disclosure of which is incorporated herein by reference.

BACKGROUND OF THE INVENTION

1. Field of the Invention

The present invention relates to a thin film capacitor, a thin film capacitor-embedded printed circuit board and a manufacturing method of the thin film capacitor, and more particularly, to a thin film capacitor capable of attaining a desired dielectric constant without high temperature heat treatment and improved in leakage current characteristics, a thin film capacitor-embedded printed circuit board and a manufacturing method of the thin film capacitor.

2. Description of the Related Art

Various kinds of passive devices mounted on a printed circuit board significantly obstruct miniaturization of products. Particularly, with semiconductor active devices increasingly embedded and the number of input and output terminals rising, the passive devices are required to occupy more space around the active devices. A representative example of passive devices includes a capacitor. The capacitor may be advantageously disposed within the closest proximity to the input terminal to reduce induced inductance resulting from a higher operating frequency.

To satisfy such a demand for small size and higher frequency, recently, studies have been vigorously conducted on a method of manufacturing an embedded capacitor. The embedded capacitor is embedded in the printed circuit board and dramatically reduces size of the product. Also, the embedded capacitor can be placed in a vicinity to the input terminal of the active device, and thus a length of conductive line may be minimized to thereby considerably lower induced inductance and eliminate high frequency noise.

As a conventional method for manufacturing this embedded capacitor, ferroelectrics with high permittivity have been dispersed in the resin. However even in this case, such a capacitor can be hardly embedded in the printed circuit board due to limited capacitance.

That is, ferroelectrics such as $BaTiO_3$ are noticeably superior in dielectric constant characteristics to paraelectrics. But to attain these excellent dielectric constant characteristics, the ferroelectrics should be treated at a temperature of e.g., 550° C. However, such heat treatment is hardly applicable to a printed circuit board employing a current substrate using polymer such as resin due to lack of heat resistance of the resin.

Paraelectrics such as $SiO_2$, $Al_2O_3$ and $Ta_2O_5$ are considerably low in dielectric constant. For example, $SiO_2$ has a dielectric constant of 3.9. Here, the paraelectrics may be heat treated to increase a dielectric constant thereof but is hardly capable of attaining a dielectric constant for a general capacitor.

Therefore, to form a capacitor-embedded printed circuit board, there has been a consistent request for developing a thin film capacitor including a dielectric layer with superior leakage current characteristics while having a desired dielectric constant without being heat-treated at a high temperature.

SUMMARY OF THE INVENTION

An aspect of the present invention provides a thin film capacitor and thin film capacitor-embedded printed circuit board, in which a dielectric layer is formed of a BiZnNb-based amorphous metal oxide having a predetermined dielectric constant without being heat treated at a high temperature, a desired dielectric constant can be obtained by adjusting a content of metallic phase bismuth of the BiZnNb-based amorphous metal oxide, and also another dielectric layer containing a different amount of the metallic phase bismuth is formed, thereby enhancing leakage current characteristics.

According to an aspect of the present invention, there is provided a thin film capacitor including: a first electrode; a dielectric layer including a first dielectric film formed on the first electrode, the dielectric layer comprising a BiZnNb-based amorphous metal oxide; and a second electrode formed on the dielectric layer, wherein the BiZnNb-based amorphous metal oxide contains metallic phase bismuth.

The dielectric layer may include a second dielectric film interposed between the first dielectric film and the first electrode, the second dielectric layer formed of a BiZnNb-based metal oxide containing a smaller amount of metallic phase bismuth than the first dielectric film. The dielectric layer may include a third dielectric film interposed between the first dielectric film and the second electrode, the third dielectric layer formed of a BiZnNb-based metal oxide containing a smaller amount of metallic phase bismuth than the first dielectric film.

The dielectric layer including the first, second and third dielectric films may be stacked at least twice into a plurality of dielectric layers.

A corresponding one of the second dielectric films and a corresponding one of the third dielectric films of the plurality of dielectric layers may be adjacent to each other and formed of an identical composition. A corresponding one of the second dielectric films adjacent to the first electrode may has a lowest content of metal phase bismuth out of the dielectric films. A corresponding one of the third dielectric films adjacent to the second electrode may has a lowest content of metal phase bismuth out of the dielectric films.

The metallic phase bismuth may have a particle size of 2 to 10 nm. The metallic phase bismuth may have a content of 46% to 50% based on moles of bismuth contained in the dielectric layer.

At least one of the first and second electrodes may include a metal selected from a group consisting of Cu, Ni, Al, Pt, Pd, Ta, Au, and Ag.

The dielectric layer may have a dielectric constant of 50 to 220. The dielectric layer may have a thickness of 0.05 µm to 1 µm.

According to another aspect of the present invention, there is provided a thin film capacitor-embedded printed circuit board including: a substrate; and a thin film capacitor including a first electrode; a dielectric layer comprising a first dielectric film formed on the first electrode, the dielectric layer comprising a BiZnNb-based amorphous metal oxide; and a second electrode formed on the dielectric layer, wherein the BiZnNb-based amorphous metal oxide contains metallic phase bismuth.

The substrate may be a copper clad laminate having copper foils on both surfaces, respectively. The first electrode may be one of the copper foils of the copper clad laminate. The substrate may be formed of polymer. The polymer may be one of an epoxy resin and polyimide.

According to still another of the present invention, there is provided a method of manufacturing a thin film capacitor, the method including: forming a dielectric layer including a first dielectric film on a first electrode, the dielectric layer comprising a BiZnNb-based amorphous metal oxide containing metallic phase bismuth; and forming a second electrode on the dielectric layer.

The dielectric layer may be formed via sputtering deposition by adjusting a ratio between an oxygen plasma and an argon plasma to control a content of the metallic phase bismuth during the sputtering deposition. A ratio of the oxygen plasma with respect to the argon plasma may range from 0 to 70%.

The method may further include: forming a second dielectric film between the first dielectric film and the first electrode, the second dielectric film comprising a BiZnNb-based amorphous metal oxide containing a smaller amount of metallic phase bismuth than the first dielectric film. The method may further include: forming a third dielectric film between the first dielectric film and the second electrode, the third dielectric film comprising a BiZnNb-based amorphous metal oxide containing a smaller amount of metallic phase bismuth than the first dielectric film.

The forming a dielectric layer may include depositing the dielectric layer via sputtering by controlling a content of the metallic phase bismuth in such a way that the first dielectric film is deposited using only an argon plasma and the second and third dielectric films are deposited by setting a ratio between an oxygen plasma and an argon plasma to 50/100.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
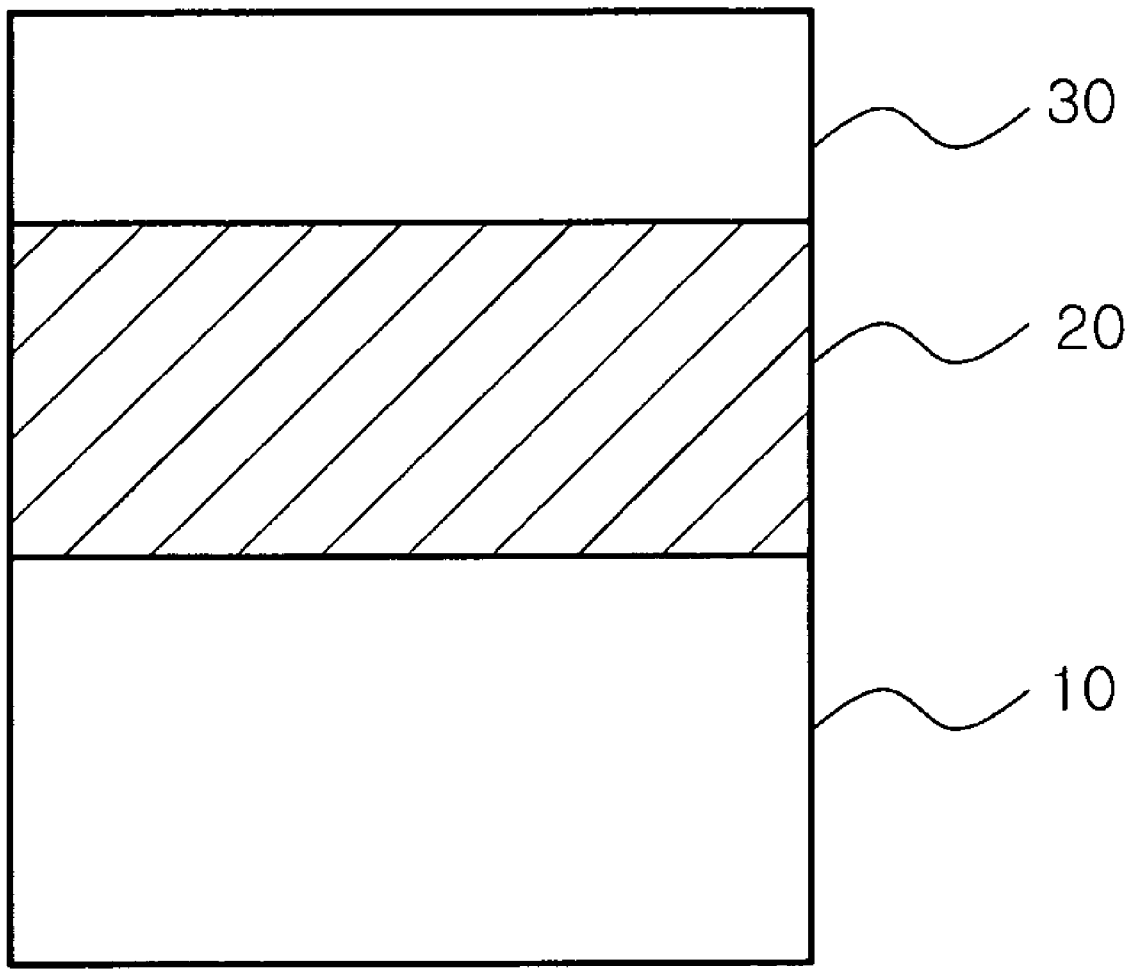
FIG. 1 is a cross-sectional view illustrating a thin film capacitor including a dielectric layer containing metallic phase bismuth according to an exemplary embodiment of the invention.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete and will fully convey the scope of the invention to those skilled in the art. In the drawings, the same reference signs are used to designate the same or similar components throughout.

FIG. 1 is a cross-sectional view illustrating a thin film capacitor including a dielectric layer containing metallic phase bismuth according to an exemplary embodiment of the invention. The thin film capacitor includes a first electrode 10, a dielectric layer 20 formed on the first electrode 10 and made of a BiZnNb-based amorphous metal oxide, and a second electrode 30 formed on the dielectric layer 20. Particularly, the BiZnNb-based amorphous metal oxide contains metallic phase bismuth.

The thin film capacitor includes the first and second electrodes 10 and 30 having polarities different from each other. The first electrode 10 and the second electrode 30 may be formed of a metal for use in a general capacitor. For example, the first electrode 10 and second electrode 30 may be formed of a metal selected from a group consisting of Cu, Ni, Al, Pt, Pd, Ta, Au, and Ag.

The dielectric layer 20 is interposed between the first electrode 10 and the second electrode 30. The dielectric layer 20 according to the present embodiment may be formed of the BiZnNb-based amorphous metal oxide. The BiZnNb-based amorphous metal oxide contains $Bi_2O_3$—$ZnO$—$Nb_2O_5$, which is however an amorphous oxide with uneven composition. The BiZnNb-based amorphous metal oxide exhibits predetermined dielectric constant characteristics even when heat-treated at a low temperature. General dielectrics are crystallized by high-temperature heat treatment to thereby demonstrate dielectric constant appropriate for the capacitor. On the contrary, the BiZnNb-based amorphous metal oxide forms a metal oxide at a low temperature and exhibits high dielectric characteristics. The BiZnNb-based amorphous metal oxide is disclosed in Korean Patent Application No. 2005-0057907.

When the BiZnNb-based amorphous metal oxide has a composition expressed by $Bi_xZn_yNb_zO_7$, x, y, and z may satisfy conditions in which $1.3 < x < 2.0$, $0.8 < y < 1.5$, and $1.4 < z < 1.6$. The BZN-based amorphous metal oxide can have a predetermined dielectric constant even when heat-treated at a low temperature, and thus the capacitor made of such BZN-based amorphous metal oxide may be embedded in a substrate made of a material incapable of withstanding high temperature, e.g., polymer substrate.

The amorphous metal oxide layer as dielectrics may be formed by a known method of forming a thin film e.g., sputtering, pulsed laser deposition (PLD), chemical vapor deposition (CVD), and metal organic deposition (MOD). As described above, the dielectric layer is formed at a low temperature of e.g., 200° C. The dielectric layer 20 may have a thickness of 0.05 μm to 1 μm.

The BiZnNb-based amorphous metal oxide may contain metallic phase bismuth. The 'metallic phase bismuth' refers to bismuth atoms bonded into Bi—Bi, not a bismuth oxide formed in the BiZnNb-based amorphous metal oxide. Such bonding of identical bismuth atoms constitutes a metallic phase. The metallic phase bismuth may have a particle size of 2 to 10 nm.

The metallic phase bismuth can be formed in the BiZnNb-based amorphous metal oxide by several methods for varying formation conditions of the dielectric layer 20. Among these, the dielectric layer 20 may be formed by sputtering. Here, the metallic phase bismuth may be formed by adjusting sputtering conditions. That is, the dielectric layer 20 may be formed by adjusting a ratio between an oxygen plasma and an argon plasma to control a content of the metallic phase bismuth by during sputtering deposition. The dielectric constant may be varied depending on sputtering conditions.

Sputtering is a deposition method in which an ion with a big energy is impinged on a target and atoms on a surface of the target are deposited on the substrate. During sputtering, as the ion, the argon plasma or oxygen plasma may be employed. The argon plasma and the oxygen plasma may be used together at a predetermined ratio. Here, to form the metallic phase bismuth, a ratio of the oxygen plasma needs to be reduced to a lowest level possible.

In a case where the oxygen plasma has a zero ratio, that is, only the argon plasma is utilized as a sputtering ion, the metallic phase bismuth is more likely to be formed. On the contrary, in a case where the oxygen plasma has a higher ratio and the argon plasma has a lower ratio, the metallic phase bismuth is decreased in ratio and the bismuth oxide is increased in ratio. The oxygen plasma has a ratio ranging from 0% to 70% with respect to the argon plasma.

The metallic phase bismuth may have a content of 46% to 50% based on moles of bismuth contained in the dielectric layer. A higher content of the metallic phase bismuth increases dielectric constant of the BiZnNb-based amorphous metal oxide. However, the bismuth content exceeding 50% leads to an extremely small amount of the bismuth oxide in the BiZnNb-based amorphous metal oxide, thereby adversely affecting the dielectric layer.

The dielectric layer 20 may have a dielectric constant of 50 to 220. As described above, the dielectric layer 20 should have a dielectric constant of a predetermined value or more to be applied to a thin film capacitor. Therefore, the dielectric layer 20 should have a dielectric constant of at least 50. Moreover, the dielectric layer 20 containing the metallic phase bismuth may have a high dielectric constant of 220.

Figure 2:
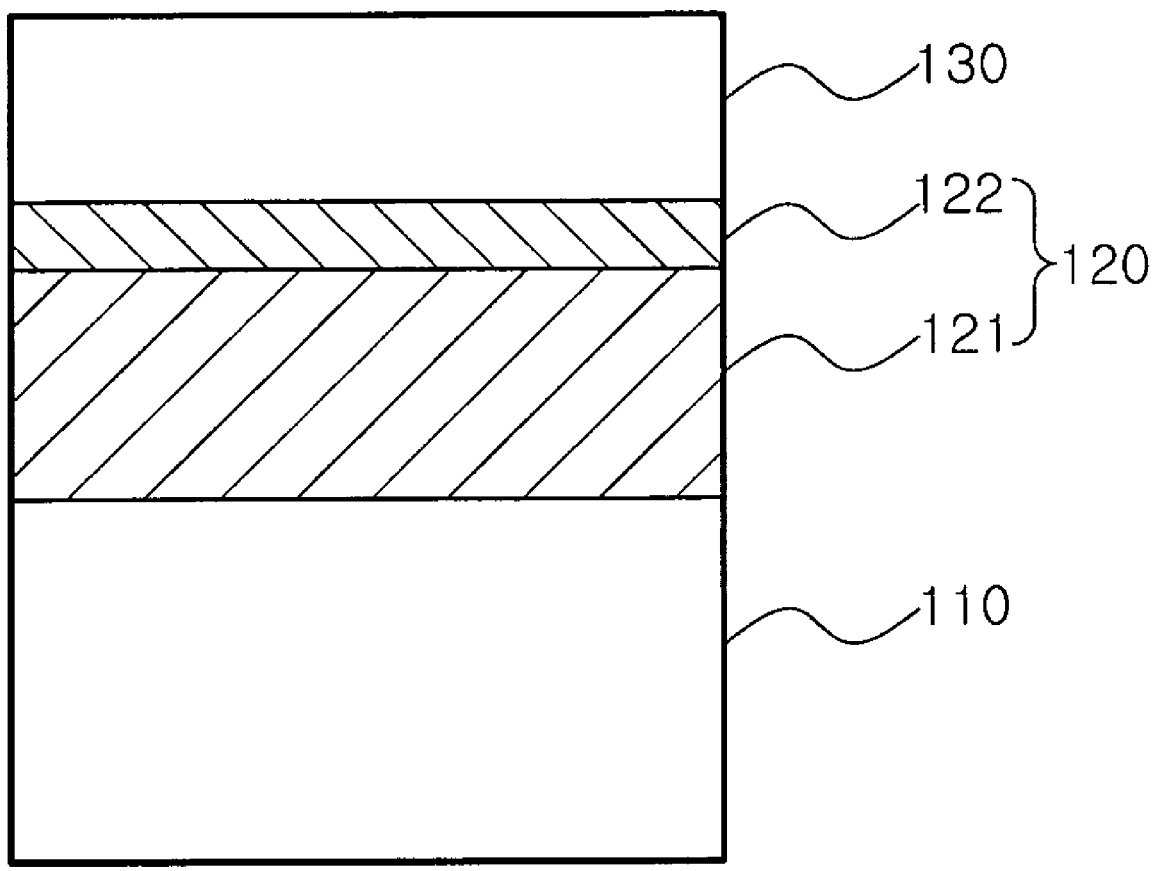
FIGS. 2 to 4 are cross-sectional views illustrating thin film capacitors having dielectric layers including two dielectric films, three dielectric films and five dielectric films, respectively to have a different content of metallic phase bismuth from one another according to an exemplary embodiment of the invention.

FIG. 2 is a cross-sectional view illustrating a thin film capacitor having a dielectric layer including two dielectric films with different contents of metallic phase bismuth from each other according to an exemplary embodiment of the invention. The dielectric layer 120 may further include a third dielectric film 122 formed between a first dielectric film and the second electrode 130. The third dielectric film may be formed of a BiZnNb-based amorphous metal oxide layer 120 containing a smaller amount of metallic phase bismuth than the first dielectric film 121. The first electrode 110, and second electrode 130 of FIG. 2 are identical to those of FIG. 1, and thus will not be described in further detail. Also, the dielectric layer 120 of FIG. 2 has characteristics identical to those of the dielectric layer of FIG. 1.

The dielectric layer 120 of FIG. 2 includes two different dielectric films, i.e., a first dielectric film 121 and a third dielectric film 122. A metallic phase bismuth content of the first dielectric film 121 is greater than a metallic phase bismuth content of the third dielectric film 122. The third dielectric film 122 is low in the metallic phase bismuth content, thereby compensating for degradation in leakage current characteristics potentially caused by addition of the metallic phase bismuth.

Presence of the metallic phase bismuth in the BiZnNb-based amorphous metal oxide may deteriorate leakage current characteristics as dielectrics. That is, the leakage current amount may be increased due to covalent bonding among bismuth elements. Therefore, with increase in the metallic phase bismuth amount, the dielectric layer 120 is increased in dielectric constant, thereby enhancing dielectric characteristics. On the contrary, this increases leakage current amount to degrade leakage current characteristics.

Therefore, to beneficially improve such leakage current characteristics, formation of the first dielectric film 121 may precede formation of the third dielectric film 122. The third dielectric film 122 may be formed of the BiZnNb-based amorphous metal oxide, which may contain a smaller amount of the metallic phase bismuth than the first dielectric film 121 or contain no amount thereof. Here, the third dielectric film 122 with superior leakage current characteristics is disposed between the second electrode 130 and the first dielectric film 121 to prevent current from being leaked from the first dielectric film 121. Referring to FIG. 2, the third dielectric film 122 is formed between the first dielectric film 121 and the second electrode. However, it is evident that a second dielectric film (not shown) may be formed between the first dielectric film 121 and the first electrode 110 in place of the third dielectric film.

Figure 3:
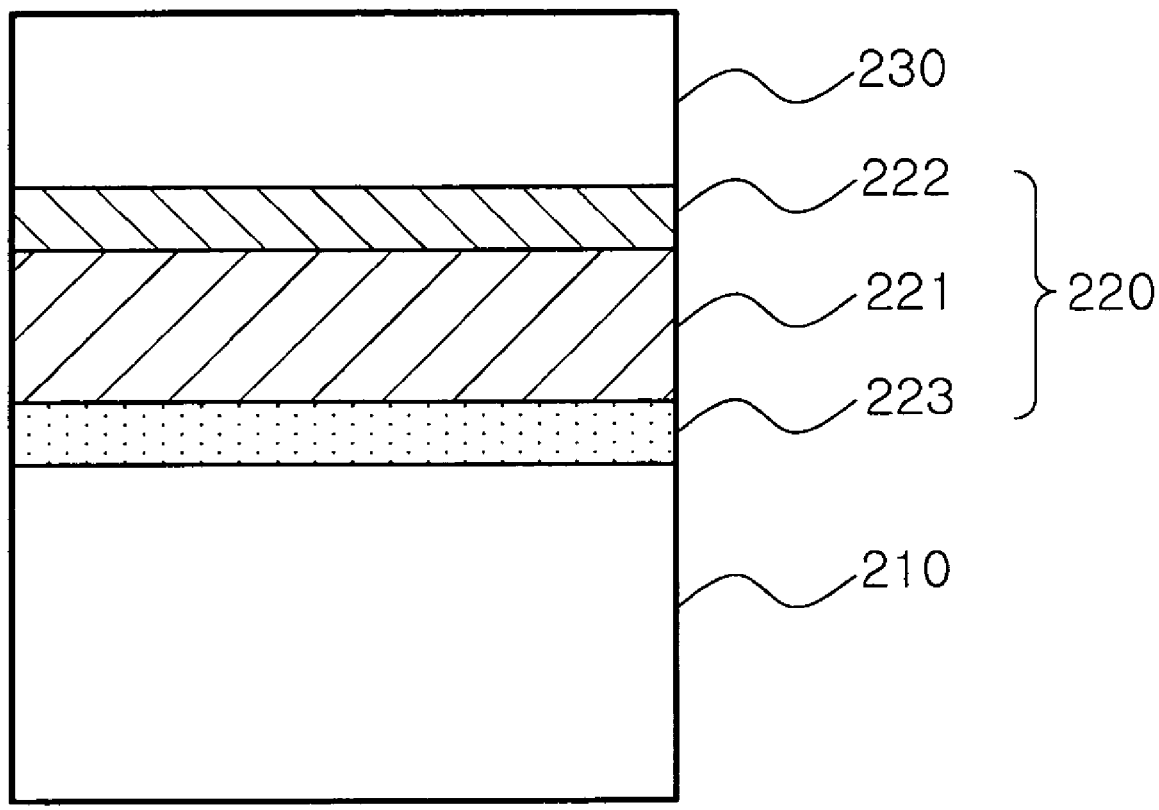

FIG. 3 is a cross-sectional view illustrating a thin film capacitor including a dielectric layer constructed of three dielectric films having different contents of metallic phase bismuth from one another according to an exemplary embodiment of the invention. The first electrode 210 and the second electrode 230 have been described earlier with reference to FIG. 1 and thus will not be explained in further detail. Also, the dielectric layer 220 of FIG. 3 has characteristics identical to those of the dielectric layer shown in FIGS. 1 and 2.

In FIG. 2, the first dielectric film 121 is formed and another film with a different content of the metallic phase bismuth is formed. However, in FIG. 3, the dielectric layer 220 may further include a second dielectric film 223 between a first dielectric film 221 and the first electrode 210. The second dielectric film 223 is formed of a BiZnNb-based amorphous metal oxide containing a smaller amount of metallic phase bismuth than the first dielectric film 221.

When the second dielectric film 223 is additionally formed, the first dielectric film 221, the second dielectric film 223, and the third dielectric film 222 constitute one dielectric layer 220. Here, the first dielectric film 221 ensures better dielectric constant characteristics and the second dielectric film 223 and the third dielectric film 222 assure better leakage current characteristics, thereby conspiring to produce the dielectric layer 220 with excellent characteristics. The second dielectric film 223 and the third dielectric film 222 may be identical to or different from each other in terms of the metallic phase bismuth content. However, the second and third dielectric films should contain a smaller amount of the metallic phase bismuth than the first dielectric film 221.

For example, the first dielectric film 221 is deposited via sputtering by using only an argon plasma. The second dielectric film 223 and the third dielectric film 222 can be deposited by setting a ratio of the oxygen plasma with respect to the argon plasma to 50%. Here, the metallic phase bismuth amount of the first dielectric film 221 surpasses the metallic phase bismuth amounts of the second dielectric film 223 and the third dielectric film 222, respectively. Therefore, the dielectric layer 220 is expected to exhibit high dielectric constant overall. Meanwhile, the second dielectric film 223 and the third dielectric film 222, which contain a smaller amount of the metallic phase bismuth than the first dielectric film 221, respectively experience less leakage current amount.

Figure 4:
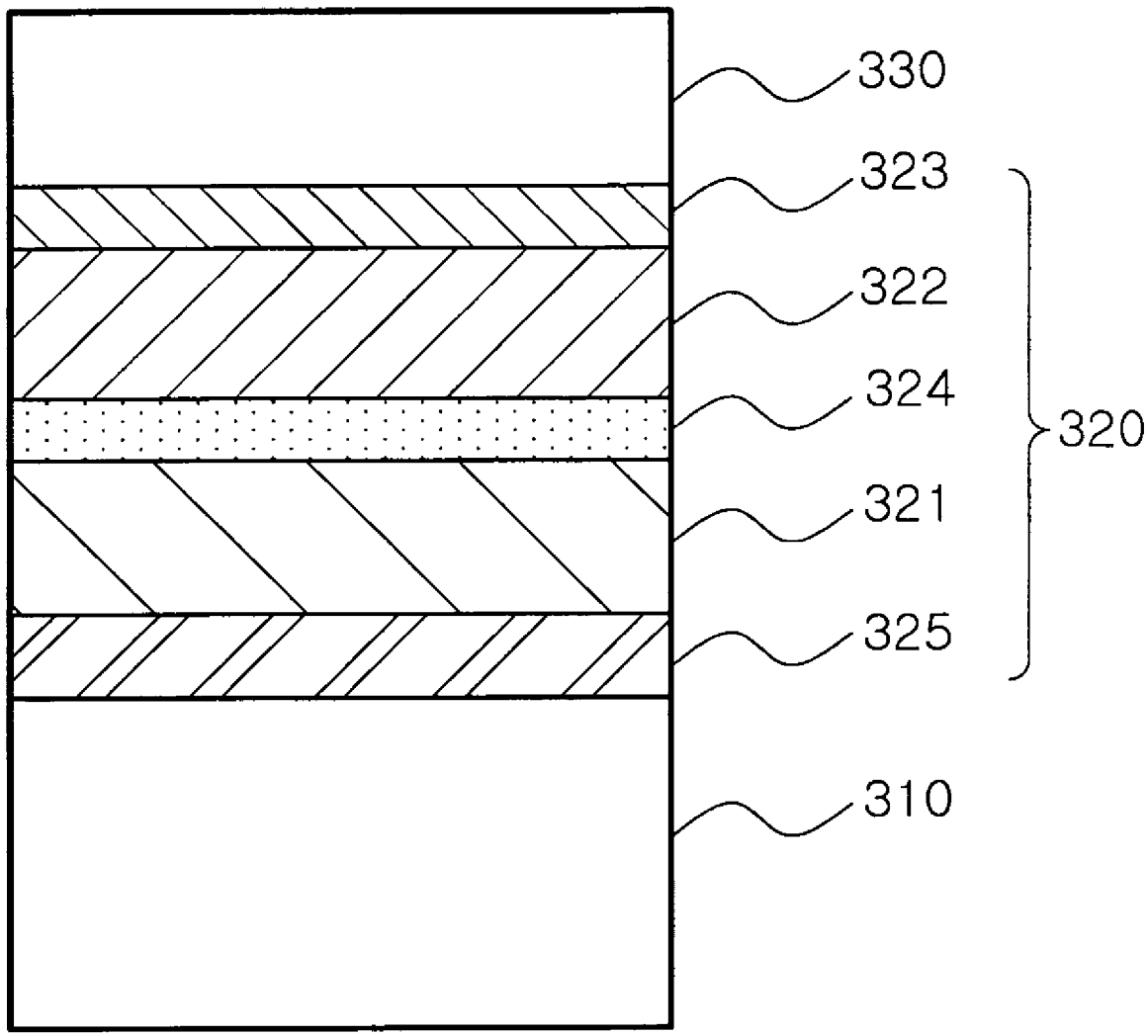

FIG. 4 is a cross-sectional view illustrating a thin film capacitor having a dielectric layer including 5 dielectric films with different contents of metallic phase bismuth from one another. First electrode 310 and second electrode 330 have been described with reference to FIG. 1 and thus will not be explained in further detail. Also, the dielectric layer 220 of FIG. 4 has characteristics identical to those of the dielectric layer shown in FIGS. 1 to 3.

Referring to FIG. 3, the dielectric layer 220 is constructed of three dielectric films including the first dielectric film 221, and the second and third dielectric film 223 having a smaller amount of the metallic phase bismuth than the first dielectric film. But the dielectric layer 320 of FIG. 4 is formed by stacking the dielectric layer 220 including three dielectric films of FIG. 3 twice. However, adjacent ones of the dielectric layers each including three dielectric films are formed of a single film.

Therefore, the dielectric layer 320 is formed to include a first dielectric film 321 containing metallic phase bismuth, a second dielectric film 325 formed between the first dielectric film 321 and the first electrode 310 and containing a smaller amount of the metallic phase bismuth than the first dielectric film 321, a third dielectric film 324 formed on the first dielectric film 321 and containing a smaller amount of metallic phase bismuth than the first dielectric film 321, a fourth dielectric film 322 formed on the third dielectric film 324 and containing a greater amount of metallic phase bismuth than the third dielectric film 324 and a fifth dielectric film 323 formed between the fourth dielectric film 322 and the second electrode 330 and containing a smaller amount of metallic phase bismuth than the fourth dielectric film 322.

As described above, the thin film capacitor of FIG. 4 further includes the fourth dielectric film 322 containing a great amount of the metallic phase bismuth compared with the third thin film capacitor. Therefore, the first dielectric film 321 ensures higher dielectric constant characteristics and the fourth dielectric film 322 assures higher dielectric constant characteristics, thereby conspiring to further improve dielectric constant characteristics of the overall thin film capacitor. The fourth dielectric film 322 may be identical to or different from the first dielectric film 321 in terms of the metallic phase bismuth content. However, the fourth dielectric film may contain the metallic phase bismuth at least in an amount ensuring better dielectric constant characteristics.

Here, the fourth dielectric film 322 may increase leakage current and thus the fifth dielectric film 323 may be additionally formed to have a smaller amount of the metallic phase bismuth than the fourth dielectric film 322, thereby suppressing leakage current. The fifth dielectric film 323 may be identical to or different from the second dielectric film 325 and the third dielectric film 324 in terms of the metallic phase bismuth content, respectively. However, the fifth dielectric film 323 should contain a smaller amount of the metallic phase bismuth than the first dielectric film 321 or the fourth dielectric film 322. Of these, the second dielectric film and the fifth dielectric film adjacent to the first electrode and the second electrode, respectively may contain a smallest amount of metallic phase bismuth to attain higher leakage current characteristics. Alternatively, the second dielectric film 325, third dielectric film 324 and fifth dielectric film 323 may not contain the metallic phase bismuth. As described above, each film can be formed via deposition so as to contain an appropriate amount of the metallic phase bismuth by adjusting a ratio between the argon and oxygen plasma.

Figure 5:
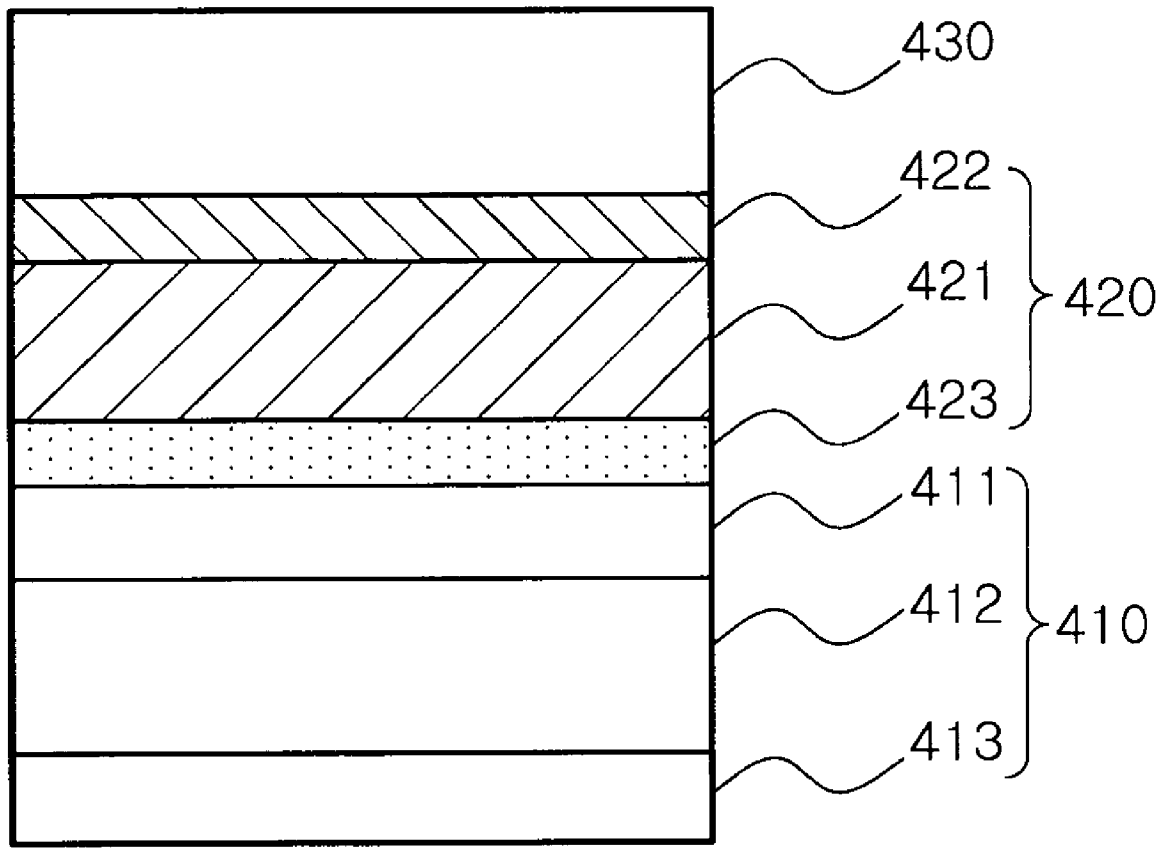
FIG. 5 is cross-sectional view illustrating a thin film capacitor-embedded printed circuit board which includes a thin film capacitor having a dielectric layer constructed of three dielectric films having different contents of metallic phase bismuth from one another, and a substrate according to an exemplary embodiment of the invention.

FIG. 5 is a cross-sectional view illustrating a thin film capacitor-embedded printed circuit board which includes a thin film capacitor constructed of three different dielectric films with different contents of metallic phase bismuth from one another, and a substrate. The present embodiment relates to an example of a method of embedding the thin film capacitor in the printed circuit board. However, the present embodiment does not limit the configuration of the thin film capacitor embedded in the printed circuit board.

The thin film capacitor-embedded printed circuit board of the present embodiment includes a substrate 410, a first electrode 411, a dielectric layer 420 formed on the first electrode 411 and made of a BiZnNb-based amorphous metal oxide, and a second electrode 430 formed on the dielectric layer 420. The dielectric layer 420 may be constructed of a first dielectric film 421 made of the BiZnNb-based amorphous metal oxide containing metallic phase bismuth.

The substrate of the thin film capacitor-embedded printed circuit board may be a copper clad laminate (CCL) having copper foils on both surfaces, respectively. Here, one of the copper foils of the CCL may serve as the first electrode 411. Therefore, the substrate 410 includes the first electrode 411 in contact with the third dielectric film 230, an insulating material 412 and a copper foil 413 formed opposite to the first electrode 411. The CCL is a substrate material having the insulating material 412 deposited in a center and copper foils deposited on the both surfaces of the insulating material 412. In a case where the capacitor is embedded in the printed circuit board as in the present embodiment, one of the copper foils is used as an electrode, thereby precluding a need for forming the first electrode 411 additionally.

The substrate 410 may be formed of one of the copper clad laminate and polymer. The polymer may utilize one of epoxy resin and polyimide. In a case where the substrate is formed of polymer, the first electrode 411 should be formed additionally. Here, the insulating material 412 may adopt resin. Therefore, in a case where the substrate is formed of copper clad laminate or polymer, the resin cannot withstand high temperature and thus entails problems when the resin is crystallized by high temperature heat treatment using ferroelectrics. However, the BiZnNb-based amorphous metal oxide, when formed at a low temperature as in the present embodiment does not yield any adverse effects on the substrate.

To manufacture the thin film capacitor-embedded printed circuit board, first, a through hole is formed in the substrate 410 to electrically connect the first electrode 411 to the copper foil 413, and then the dielectric layer 420 is formed. The second electrode 430 is formed and insulating layers are formed on the copper foil 413 and the second electrode 430 to prevent current leakage. Vias are formed in the insulating layers. Here, a necessary number of insulating layers and vias are formed to be connected to an external power source. At this time, a process of forming the through hole or vias in the first electrode 411, the second electrode 430, the dielectric layer 420 and the copper foil for electrical connection is a known technology and thus not illustrated in the drawings. Also, this will not be explained in any detail.

Hereinafter, the present invention will be described in greater detail by way of examples, which are however exemplary but do not limit the present invention.

INVENTIVE EXAMPLE 1

CCL was utilized as a substrate, and first, one surface of the CCL was electroplated. The one surface of the CCL was copper-plated to a thickness of 5 μm to 10 μm to reduce defects of copper foils of the CCL and decrease surface roughness.

A dielectric layer was deposited on the copper-plated CCL by sputtering. The sputtering was performed at a power of 500 W and a pressure of 4 mTorr to 12 mTorr. Also, a ratio of an oxygen plasma was varied from 0% to 70% with respect to an argon plasma. The deposited dielectric layer was measured for chemical bonding using an X-ray photoelectric spectrophotometer.

Figure 6:
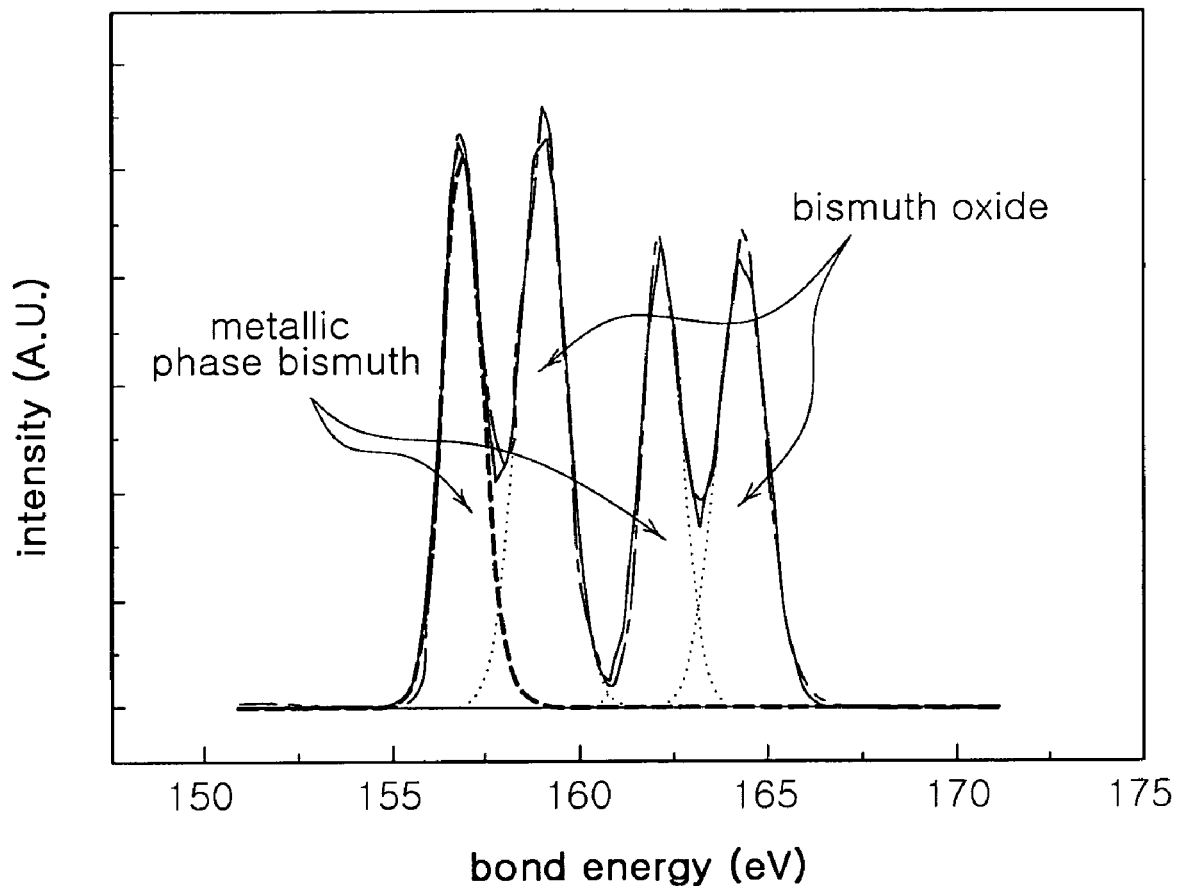
FIG. 6 illustrates a measurement of chemical bonding of a dielectric layer formed by using only an argon plasma during sputtering of the dielectric layer.
Figure 7:
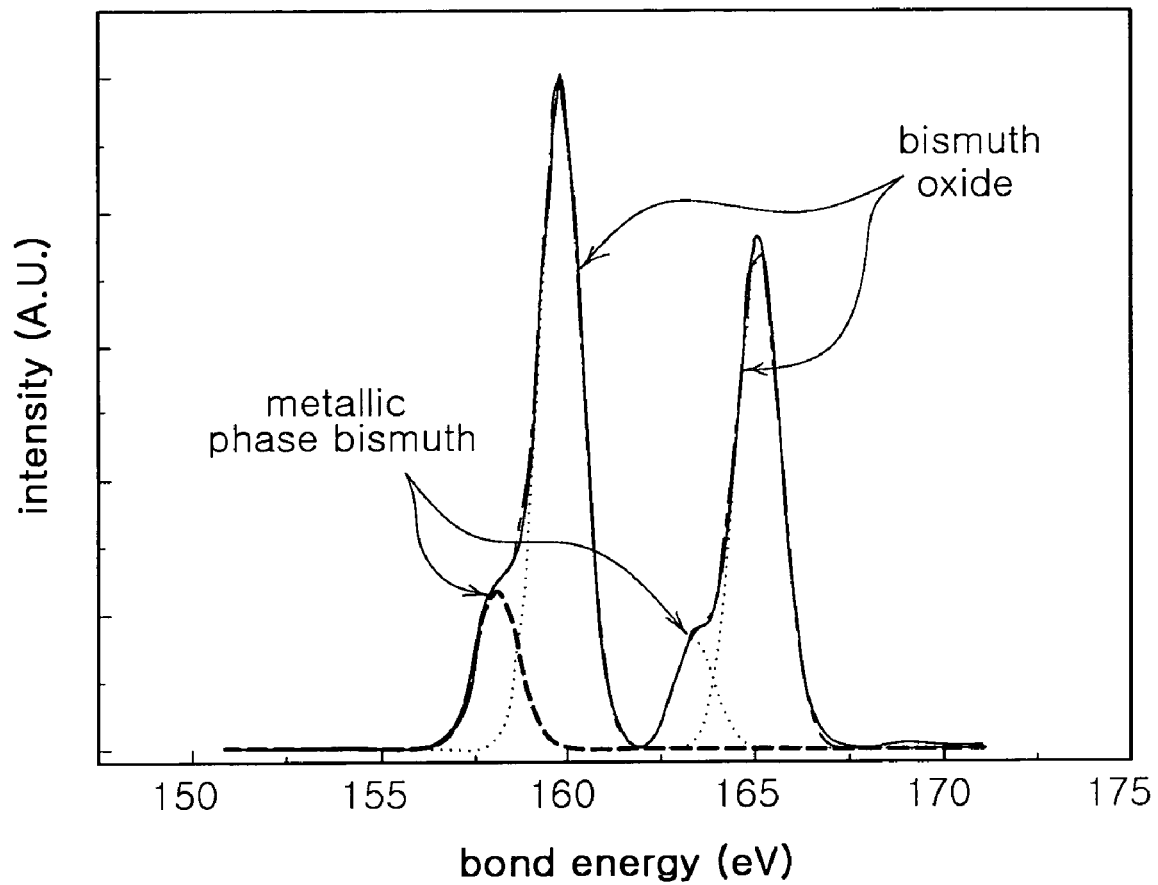
FIG. 7 illustrates a measurement of chemical bonding of a dielectric layer formed by using both an argon plasma and an oxygen plasma during sputtering of the dielectric layer.

FIG. 6 illustrates a measurement of chemical bonding of the dielectric layer formed using only the argon plasma (300 sccm) during sputtering under condition A. FIG. 7 illustrates a measurement of chemical bonding of the dielectric layer formed using both the argon plasma (300 sccm) and the oxygen plasma (20 sccm) during sputtering under condition B.

FIG. 6 clearly shows peaks of metallic phase bismuth. That is, when only the argon plasma is used, the metallic phase bismuth is present in the dielectric layer. The shape of the peaks indicates that an amount of the metallic phase bismuth is substantially equal to an amount of bismuth oxide.

On the other hand, referring to FIG. 7, the metallic phase bismuth rarely shows peaks in the dielectric layer. But only bismuth oxide demonstrates clear peaks. Therefore, when the oxygen plasma is used together with the argon plasma, the metallic phase bismuth is lowered in content.

Table 1 below notes the content of metallic phase bismuth and dielectric characteristics under both conditions.

TABLE 1

|  | Condition 1 | | | Condition 2 | | |
|---|---|---|---|---|---|---|
| Pressure (mTorr) | Metal phase bismuth (%) | Dielectric constant (k) | Loss coefficient | Metal phase bismuth (%) | Dielectric Constant (k) | Loss coefficient |
| 4.3 | 50.3 | 200 | 0.6 | 24.5 | 35 | 0.04 |
| 8 | 49.9 | 201 | 0.6 | 23.3 | 35 | 0.02 |
| 12 | 46.1 | 217 | 0.5 | 16.4 | 34 | 0.02 |

In Table 1, as for condition 1, the metallic phase bismuth has a content of about 45 to 50% and also dielectric constant is about 200 to 220, thereby exhibiting superior dielectric characteristics to condition 2. Loss coefficient will not be compared due to big dielectric constant of condition 1.

INVENTIVE EXAMPLE 2

In Inventive Example 2, a dielectric layer was deposited under condition equal to condition 1 except that deposition was performed at a fixed pressure of 12 mTorr, and an amount of argon plasma was 100 sccm while an amount of oxygen plasma was varied.

Figure 8:
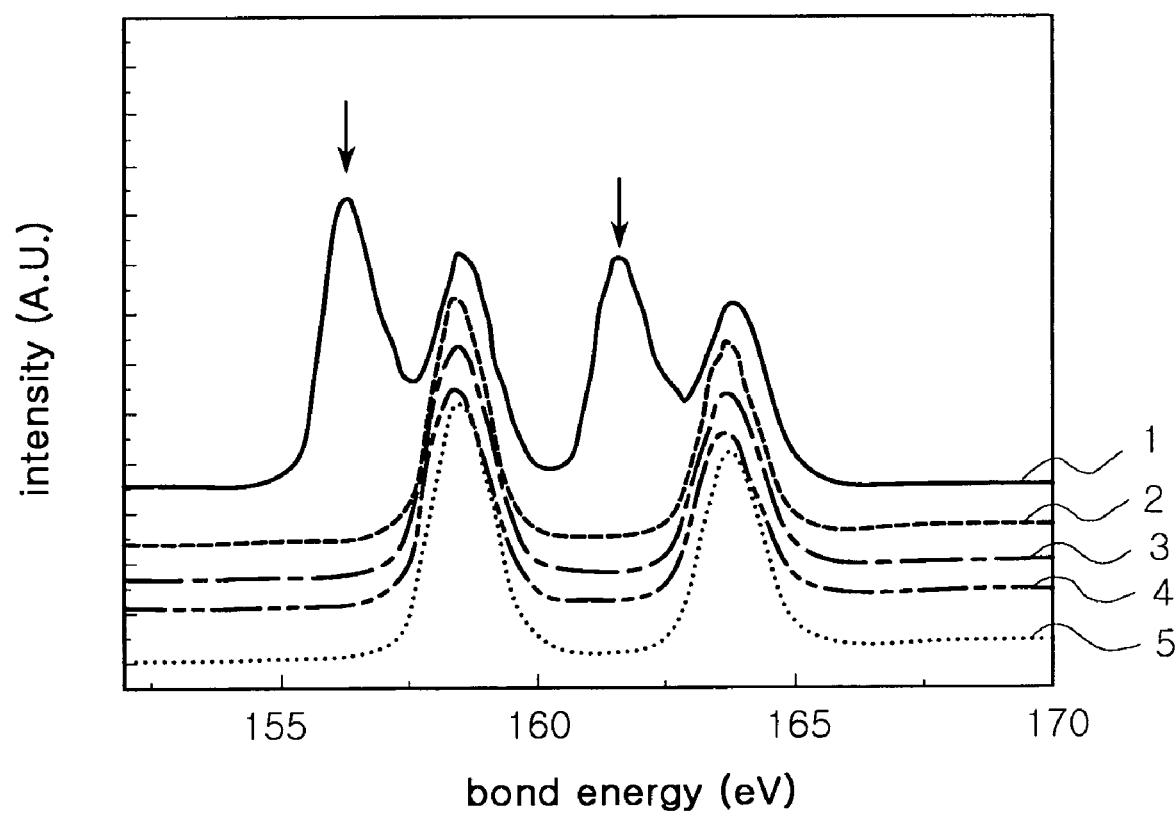
FIG. 8 illustrates a measurement of chemical bonding of a dielectric layer formed by varying a ratio between an argon plasma and an oxygen plasma.

FIG. 8 illustrates a measurement of chemical bonding of the dielectric layer formed by varying a ratio between the argon plasma and oxygen plasma as in Inventive Example 2. FIG. 8 shows five graphs indicated with 1, 2, 3, 4 and 5 in which a ratio between the argon plasma and oxygen plasma was 100, 100/5, 100/20, 100/50, and 100/70, respectively.

Referring to FIG. 8, graph 1 shows peaks of the metallic phase bismuth near arrows only when the argon plasma of 100 sccm was utilized. Here, the amount of the metallic phase bismuth was 50%. However, when the oxygen plasma was used with the argon plasma, the metallic phase bismuth showed no peaks. When a smaller amount of the argon plasma was used compared with Inventive Example 1, the metallic phase bismuth was hardly formed due to too high a ratio of the oxygen plasma.

Table 2 below notes the aforesaid dielectric characteristics of the dielectric layer.

TABLE 2

| Sample No. | Argon/Oxygen | Dielectric constant | Loss coefficient |
|---|---|---|---|
| 1 | 100/0 | 113 | 0.25 |
| 2 | 100/5 | 28 | 0.04 |
| 3 | 100/20 | 29 | 0.015 |
| 4 | 100/50 | 36 | 0.015 |
| 5 | 100/70 | 24 | 0.015 |

The dielectric film exhibited a high dielectric constant when only the argon plasma was used. The dielectric film formed using both the argon plasma and oxygen plasma demonstrated low dielectric characteristics overall. A ratio of the oxygen plasma did not affect dielectric constant significantly.

By way of these examples, optimal conditions for forming the dielectric layer with high permittivity and low loss coefficient were derived. First, an argon plasma and oxygen plasma with a ratio of 100 sccm/50 sccm were deposited for 10 minutes at a pressure of 2.0 mTorr. Then only the argon plasma was deposited for 28 minutes at a pressure of 2.8 mTorr. Finally, the argon plasma and oxygen plasma with a ratio of 100 sccm and 50 sccm were deposited for 10 minutes at a pressure of 2.0 mTorr. This led to formation of a dielectric layer including three dielectric films. Here, the dielectric layer had a dielectric constant of 102, a capacitive density of 200 nF/cm$^2$, and a loss coefficient of 0.15, which were superb characteristics ensuring the dielectric layer to be used as an thin film embedded capacitor.

Therefore, the dielectric layer including the three dielectric films was formed such that an outer film in contact with the electrode layer had a smaller content of metallic phase bismuth to enhance leakage current characteristics, and an inner film was deposited by sputtering using only the argon plasma to increase a content of metallic phase bismuth in order to enhance overall dielectric characteristics of the dielectric layer.

As set forth above, according to exemplary embodiments of the invention, a thin film capacitor is formed using a BiZnNb-based amorphous metal oxide having a dielectric constant required as a capacitor without being heat treated at a high temperature.

Also, a dielectric layer has a dielectric constant increasing according to a greater content of the metallic phase bismuth in the BiZnNb-based amorphous metal oxide. Therefore, a desired dielectric constant is obtained by adjusting the content of the metallic phase bismuth.

Moreover, another dielectric layer containing a different amount of metallic phase bismuth can be formed to enhance leakage current characteristics.

While the present invention has been shown and described in connection with the exemplary embodiments, it will be apparent to those skilled in the art that modifications and variations can be made without departing from the spirit and scope of the invention as defined by the appended claims.

What is claimed is:

1. A thin film capacitor comprising:
a first electrode;
a dielectric layer comprising a first dielectric film formed on the first electrode, the dielectric layer comprising a BiZnNb-based amorphous metal oxide; and
a second electrode formed on the dielectric layer,
wherein the BiZnNb-based amorphous metal oxide contains a metallic phase bismuth, the dielectric layer comprises a second dielectric film interposed between the first dielectric film and the first electrode, the second dielectric film formed of a BiZnNb-based metal oxide containing a smaller amount of the metallic phase bismuth than the first dielectric film, and the dielectric layer comprises a third dielectric film interposed between the first dielectric film and the second electrode, the third dielectric film formed of a BiZnNb-based metal oxide containing a smaller amount of the metallic phase bismuth than the first dielectric film, wherein the dielectric layer comprising the first, second and third dielectric films is stacked at least twice into a plurality of dielectric layers.

2. The thin film capacitor of claim 1, wherein a corresponding one of the second dielectric films and a corresponding one of the third dielectric films of the plurality of dielectric layers are adjacent to each other and formed of an identical composition.

3. The thin film capacitor of claim 1, wherein a corresponding one of the second dielectric films adjacent to the first electrode has a lowest content of metal phase bismuth out of the dielectric films.

4. The thin film capacitor of claim 1, wherein a corresponding one of the third dielectric films adjacent to the second electrode has a lowest content of metal phase bismuth out of the dielectric films.

5. The thin film capacitor of claim 1, wherein the metallic phase bismuth has a particle size of 2 to 10 nm.

6. The thin film capacitor of claim 1, wherein the metallic phase bismuth has a content of 46% to 50% based on moles of bismuth contained in the dielectric layer.

7. The thin film capacitor of claim 1, wherein the dielectric layer has a dielectric constant of 50 to 220.

8. The thin film capacitor of claim 1, wherein the dielectric layer has a thickness of 0.05 μm to 1 μm.

9. The thin film capacitor of claim 1, wherein at least one of the first and second electrodes comprises one selected from a group consisting of Cu, Ni, Al, Pt, Pd, Ta, Au, and Ag.

10. A thin film capacitor-embedded printed circuit board comprising:
a substrate; and
a thin film capacitor including
a first electrode;
a dielectric layer comprising a first dielectric film formed on the first electrode,
the dielectric layer comprising a BiZnNb-based amorphous metal oxide; and
a second electrode formed on the dielectric layer,
wherein the BiZnNb-based amorphous metal oxide contains a metallic phase bismuth, the dielectric layer comprises a second dielectric film interposed between the first dielectric film and the first electrode, the second dielectric film formed of a BiZnNb-based metal oxide containing a smaller amount of the metallic phase bismuth than the first dielectric film, and
the dielectric layer comprises a third dielectric film interposed between the first dielectric film and the second electrode, the third dielectric film formed of a BiZnNb-based metal oxide containing a smaller amount of the metallic phase bismuth than the first dielectric film, wherein the dielectric layer comprising the first, second and third dielectric films is stacked at least twice into a plurality of dielectric layers.

11. The thin film capacitor-embedded printed circuit board of claim 10, wherein the substrate is a copper clad laminate having copper foils on both surfaces, respectively.

12. The thin film capacitor-embedded printed circuit board of claim 11, wherein the first electrode comprises one of the copper foils of the copper clad laminate.

13. The thin film capacitor-embedded printed circuit board of claim 10, wherein the substrate is formed of polymer.

14. The thin film capacitor-embedded printed circuit board of claim 13, wherein the polymer comprises one of an epoxy resin and polyimide.

15. A method of manufacturing a thin film capacitor, the method comprising:
forming a dielectric layer comprising a first dielectric film on a first electrode, the dielectric layer comprising a BiZnNb-based amorphous metal oxide containing metallic phase bismuth; and forming a second electrode on the dielectric layer,
the dielectric layer comprises a second dielectric film interposed between the first dielectric film and the first electrode, the second dielectric film formed of a BiZnNb-based metal oxide containing a smaller amount of the metallic phase bismuth than the first dielectric film, and the dielectric layer comprises a third dielectric film interposed between the first dielectric film and the second electrode, the third dielectric film formed of a BiZnNb-based metal oxide containing a smaller amount of the metallic phase bismuth than the first dielectric film,
wherein the dielectric layer comprising the first, second and third dielectric films is stacked at least twice into a plurality of dielectric layers.

16. The method of claim 15, wherein the dielectric layer is formed via sputtering deposition by adjusting a ratio between an oxygen plasma and an argon plasma to control a content of the metallic phase bismuth during the sputtering deposition.

17. The method of claim 16, wherein the ratio of the oxygen plasma with respect to the argon plasma ranges from 0 to 70%.

18. The method of claim 15, wherein the forming a dielectric layer comprises depositing the dielectric layer via sputtering by controlling a content of the metallic phase bismuth in such a way that the first dielectric film is deposited using only an argon plasma and the second and third dielectric films are deposited by setting a ratio between an oxygen plasma and an argon plasma to 50/100.

* * * * *